United States Patent [19]

Taylor, Jr.

[11] Patent Number: 5,001,489
[45] Date of Patent: Mar. 19, 1991

[54] DIGITAL PHASE DETECTOR

[75] Inventor: John W. Taylor, Jr., Baltimore, Md.

[73] Assignee: Westinghouse Electric Corp., Pittsburgh, Pa.

[21] Appl. No.: 266,195

[22] Filed: Nov. 2, 1988

[51] Int. Cl.[5] .......................... G01S 13/44; G01S 13/68
[52] U.S. Cl. .................................... 342/194; 342/195; 342/152
[58] Field of Search ................. 342/194, 195, 188, 152

[56] References Cited

U.S. PATENT DOCUMENTS

| | | | |
|---|---|---|---|
| 4,137,533 | 1/1979 | Briechle et al. | 342/162 |
| 4,231,005 | 10/1980 | Taylor, Jr. | 342/194 |
| 4,560,961 | 12/1985 | Kestenbaum | 332/23 A |
| 4,591,862 | 5/1986 | Parkhurst et al. | 342/427 |
| 4,926,184 | 5/1990 | Galati et al. | 342/149 |

*Primary Examiner*—Thomas H. Tarcza
*Assistant Examiner*—John B. Sotomayor
*Attorney, Agent, or Firm*—W. G. Sutcliff

[57] ABSTRACT

A phase detector receives two input digital signals representing Cartesian coordinates of a vector and outputs a digital signal indicative of the phase angle of the vector. The input digital signals are logarithms of the square of, for example, in-phase and quadrature components of a radar signal and are subtracted in the phase detector to produce a difference signal having a magnitude and a polarity. The polarities of the difference signal and the two information signals are used to determine the octant of the phase angle by addressing a read only memory. The magnitude of the difference signal is used as an address of a read only memory storing digital values corresponding to angles within an octant. The octant output by the first read only memory and the angle output by the second read only memory together indicate the phase angle of the vector.

10 Claims, 1 Drawing Sheet

DIGITAL PHASE DETECTOR

BACKGROUND OF THE INVENTION

1. Field of the Invention

The present invention is related to detection of the phase of a signal and, more particularly, to a method and apparatus for detecting a phase angle from two information signals representing in digital form the Cartesian coordinates of the tip of a signal vector.

2. Description of the Related Art

There are numerous situations in which it is necessary to determine the phase of an oscillating signal. For example, determinations of the phase of signals derived from radar echoes are used in extracting the range rate of a target. Phase is also useful in determining the monopulse angle and to reduce the number of bits required for recording data.

Conventionally, radar signals are processed as digital signals after pulse compression representing the real and imaginary, or in-phase (I) and quadrature (Q) components of a received signal. Known techniques for determining the phase from these signals involve multiplication and division, including squaring some values and taking the square root of others. Thus, a device constructed to perform such calculations in real time requires extremely fast processors or specially constructed arithmetic processors for performing the calculations in hardware. As a result, most conventional radar systems do no utilize calculations of phase angle that are more precise than a determination of the octant of the phase.

SUMMARY OF THE INVENTION

An object of the present invention is to determine the phase angle of signal with a precision of better than 5° without performing any multiplication or division.

Another object of the present invention is to determine the phase of a radar signal quickly, using signals commonly available in a digital radar system.

The above objects are attained by providing a method for detecting phase angle, comprising the steps of: supplying inputs signals representing logarithms of the magnitudes of two information signals; supplying polarity signals representing polarities of the two information signals; performing a subtraction operation on the input digital signals to produce a difference signal representing a difference between the input digital signals; and accessing a memory unit, containing a table of digital values indicative of phase angles, using the difference signal and the polarity signals to select one of the digital values to provide an indication of the phase angles of the two information signals. Preferably, the memory unit includes octant storage means for storing a table of octants in a plane, addressed by the polarity signals and the polarity of the difference signal to produce an octant signal and angle storage means for storing angles within an octant at addresses corresponding to the logarithm (base 2) of the square of the tangent of the angles stored therein, addressed by the absolute value of and the polarity of the difference signal and a least significant bit of the octant signal.

These objects, together with other objects and advantages which will be subsequently apparent, reside in the details of construction and operation as more fully hereinafter described and claimed, reference being had to the accompanying drawings forming a part hereof, wherein like reference numerals refer to like parts throughout.

DESCRIPTION OF THE PREFERRED EMBODIMENT

Figure 1:
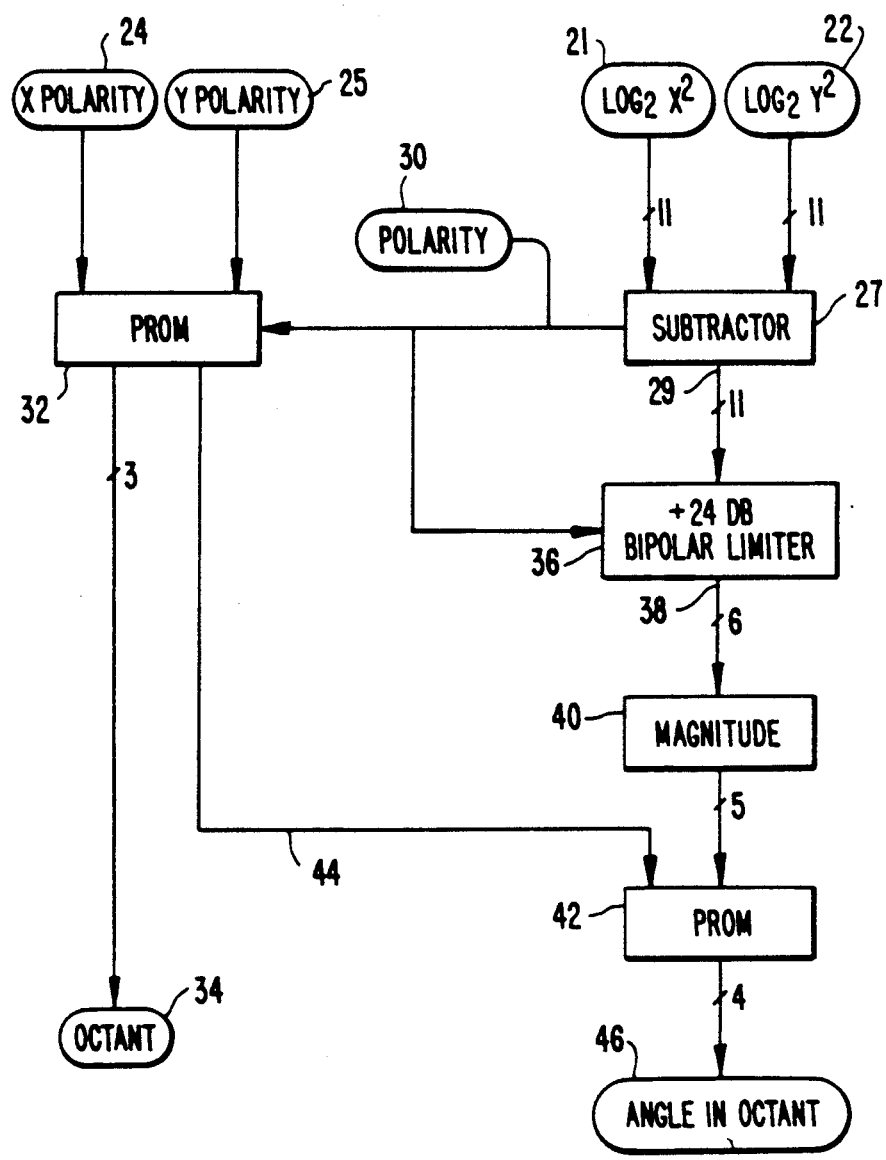
FIG. 1 is a block diagram of a digital phase detector according to the present invention.

As illustrated in FIG. 1, a digital phase detector according to the present invention receives input digital signals 21 and 22 representing logarithms of two information signals having a 90° phase difference therebetween. In the embodiment illustrated in FIG. 1, the input digital signals 21, 22 are logarithms in base 2 of the square of the Cartesian coordinates of the signals output from a doppler filter, such as a moving target indicator (MTI), which is commonly available in digital radar systems. In an application where such signals are not already available, the logarithm of the square of the in-phase (I) and quadrature (Q) signals corresponding to the real and imaginary components of, e.g., a received radar signal can be used instead of $x^2$ and $y^2$. The logarithms of these signals can be obtained using conventional techniques.

In the embodiment illustrated in FIG. 1, the input digital values 21 and 22 each have 11 bits, corresponding to the number of bits in an airport surveillance radar system. A subtractor 27 performs a subtraction operation on the input digital signals by subtracting one of the input digital signals, e.g., signal 22 from the other of the input digital signals, e.g., signal 21, to produce a difference signal 29 having 11 bits and a polarity signal 30.

In the preferred embodiment, a programmable read only memory (PROM) is used as octant storage means 32 for storing a table of octants in a plane, addressed by the polarity signals 24, 25 and 30 to produce an octant signal 34. The polarity signal 30 is also supplied to limiting means 36 for limiting the difference signal 29 when the difference signal 29 approaches a predetermined value having a corresponding angle approximately equal to one of 0°, 90°, 180° and 270°.

The limiter 36 outputs a limited difference signal 38 having six bits in the preferred embodiment. Due to the inclusion of both phase and amplitude, the amplitude of the logarithmic input signals 21 and 22 can define a 96 dB dynamic range with a least significant bit representing 3/32 dB. This provides quantization of the phase angle at about one percent of a radian or approximately 2.8°.

A magnitude circuit 40 receives the limited difference signal 38 and supplies the absolute value of the limited difference signal to another PROM used as angle storage means 42 for storing angles within an octant at addresses corresponding to the tangent of the angles stored therein, addressed by the limited absolute value 38 of the difference signal and the least significant bit 44 of the octant. The angle within the octant 46 output by the angle storage means 42 has four bits in the preferred embodiment. This divides a 45° octant into 2.8° sections. Increased resolution can be provided by increasing the number of digits processed by the system. Since the only operations are subtraction and table look ups, the number of digits can be increased easily with little effect other than to increase the size of the angle storage means 42 and to increase the number of bits processed by the doppler filter or other circuits which produce the logarithmic input signals 21, 22.

As is known in the art, the change in phase angle combined with the interpulse period define the frequency of the return signal. Thus, a digital phase detector according to the present invention can be used to perform analysis of the doppler frequencies present in a returned radar signal and, thereby, analysis of the velocity of the object from which the transmitted signal is reflected.

The many features and advantages of the present invention are apparent from the detailed specification and thus, it is intended by the appended claims to cover all such features and advantages of the method and apparatus which fall within the true spirit and scope of the invention. Further, since numerous modifications and changes will readily occur to those skilled in the art, it is not desired to limit the invention to the exact construction and operation illustrated and described. Accordingly, all suitable modifications and equivalents may be resorted to falling within the scope and spirit of the invention.

What is claimed is:

1. A method for detecting a phase angle, comprising the steps of:
    (a) supplying input digital signals representing logarithms of the magnitudes of two information signals;
    (b) supplying polarity signals representing polarities of the two information signals;
    (c) performing a subtraction operation on the input digital signals to produce a difference signal representing a difference between the input digital signals; and
    (d) accessing a memory unit, containing a table of digital values indicative of phase angles within an octant, using the difference signal and the polarity signals to select one of the digital values to provide an indication of the phase angle represented by the two information signals.

2. A method as recited in claim 1, further comprising the step of (e) storing, prior to performing steps (a)-(b), the phase angles at addresses of the memory unit determined by the logarithm (base 2) of the square of the tangent of the phase angles stored therein.

3. A method as recited in claim 1, wherein step (a) comprises supplying logarithms of squared magnitudes of in-phase and quadrature components of a received radar signal as the input digital signals where the information signals correspond to the in-phase and quadrature components of the received radar signal.

4. A method as recited in claim 1, wherein step (a) comprises supplying output signals from a doppler filter in a radar receiver.

5. A method as recited in claim 1, further comprising the step of (e) determining the octant of the phase angle represented by the two information signals in dependence upon the polarity signals supplied in step (b) and the polarity of the difference between the input digital signals.

6. An apparatus for detecting a phase angle, comprising:
    input means for supplying input digital signals representing logarithms of the magnitudes of two information signals and for supplying polarity signals representing the polarities of the two information signals;
    subtraction means for performing a subtraction operation on the input digital signals to produce a difference signal representing a difference between the input digital signals; and
    memory means for storing a table of digital values indicative of phase angles within an octant and for accessing the table using the difference signal and the polarity signals to select one of the digital values to provide an indication of the phase angles of the two information signals.

7. An apparatus as recited in claim 6, wherein said subtraction means comprises a digital subtractor, operatively connected to receive the two input digital signals and to said memory unit, for subtracting one of the two input digital signals from the other of the two input digital signals and for outputting the difference signal and a third polarity signal indicative of the polarity of the difference between the two input digital signals.

8. An apparatus as recited in claim 7, wherein said memory means comprises:
    octant storage means for storing a table of octants in a plane, addressed by the first, second and third polarity signals to produce an octant signal;
    magnitude means for receiving the difference signal and outputting the absolute value of the difference signal; and
    angle storage means for storing angles within an octant at addresses corresponding to a logarithm (base 2) of the square of the tangent of the angles stored therein, addressed by the absolute value of the difference signal, the third polarity signal and a least significant bit of the octant signal.

9. An apparatus as recited in claim 8, wherein said memory means further comprises limiting means for limiting the difference signal when the difference signal approaches a predetermined value having a corresponding angle approximately equal to one of 0°, 90°, 180° and 270°.

10. An apparatus as recited in claim 9,
    wherein said octant storage means comprises a first read only memory operatively connected to receive the first and second polarity signals and to said digital subtractor to receive the third polarity signal, and
    wherein said angle storage means comprises a second read only memory operatively connected to said limiting means to receive the absolute value of the difference between the two input digital signals and to said first read only memory to receive the least significant bit of the octant signal, as address signals.

* * * * *